United States Patent
Kim et al.

(10) Patent No.: US 7,253,056 B2
(45) Date of Patent: Aug. 7, 2007

(54) FLASH MEMORY CELL AND METHOD FOR MANUFACTURING THE SAME

(75) Inventors: Jum Soo Kim, Icheon (KR); Ji Hyung Yune, Goyang (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/315,148

(22) Filed: Dec. 23, 2005

(65) Prior Publication Data

US 2006/0138524 A1 Jun. 29, 2006

(30) Foreign Application Priority Data

Dec. 23, 2004 (KR) .................. 10-2004-0111472

(51) Int. Cl.
*H01L 21/336* (2006.01)
(52) U.S. Cl. .................. 438/259; 438/296; 257/E21.68
(58) Field of Classification Search ................ 438/259, 438/262, 263, 296, 426, 526; 257/E21.68, 257/E21.681
See application file for complete search history.

(56) References Cited

U.S. PATENT DOCUMENTS

| | | | | |
|---|---|---|---|---|
| 6,218,265 B1 * | 4/2001 | Colpani | ...................... | 438/424 |
| 6,437,397 B1 * | 8/2002 | Lin et al. | .................... | 438/259 |
| 6,596,586 B1 * | 7/2003 | Yang et al. | ................. | 438/259 |

* cited by examiner

*Primary Examiner*—Chandra Chaudhari
(74) *Attorney, Agent, or Firm*—McKenna Long & Aldridge LLP

(57) ABSTRACT

An active region and a trench region are formed on a semiconductor substrate. The trench region is filled with a dielectric material to form an isolation layer. Oxide and polysilicon layers are formed on the semiconductor substrate. A second polysilicon layer, a second oxide layer, and a first polysilicon layer are patterned to form a plurality of gate lines. Deep ion implantation in a deep portion of the active region is performed using a self-aligned source mask. The active region and the trench region are exposed through the self-aligned source mask by etching the isolation layer between the plurality of gate lines using the self-aligned source mask to form a common source region. Ions are implanted in the common source region using the self-aligned source mask.

14 Claims, 2 Drawing Sheets

FLASH MEMORY CELL AND METHOD FOR MANUFACTURING THE SAME

CROSS-REFERENCE TO RELATED APPLICATIONS

This application claims the benefit of Korean Patent Application No. 10-2004-0111472, filed on Dec. 23, 2004, which is hereby incorporated by reference for all purposes as if fully set forth herein.

BACKGROUND OF THE INVENTION

1. Field of the Invention

The present invention relates to a flash memory cell and a method for manufacturing the same.

2. Discussion of the Related Art

A flash memory cell is a device fabricated by adopting the merits and principles of EPROM, which has programmable and erasable characteristics, and of EEPROM which has electrically programmable and erasable characteristics. The flash memory cell includes a thin tunnel oxide film formed on a silicon substrate, a floating gate and a control gate stacked on the oxide film, and source and drain regions formed on an exposed portion of the substrate. A dielectric layer is interposed between the floating gate and the control gate. The flash memory cell allows storage of one bit in a single transistor and performs electrical programming and erasing.

The flash memory cell includes a source connecting layer which connects source regions of respective unit cells to form a source line. The source connecting layer can be fabricated by a metal contact method which connects metal contacts to one another after forming the metal contacts in the respective unit cells. However, this method is not suitable for highly integrated devices due to contact margin. Accordingly, a common source line comprising an impurity diffusion layer formed by a self-aligned source (SAS) process has been increasingly applied so that high integration of devices may be implemented.

Specifically, with a multilayered gate electrode formed on a substrate, the SAS process exposes a source region of each cell by using a separate SAS mask. A field oxide film is then removed by anisotropic etching to form a common source line adjacent cells. The SAS process can reduce the area of each cell in a bit line direction, especially a space between the gate and the source region. Thus, it is a necessary process for a 0.25 μm level technique. The SAS process described above can reduce the area of the cell by about 20%. However, the SAS process has at least one disadvantage. When the SAS process is applied in a memory cell where the common source line is formed along a profile of a trench region, a contact resistance of the source region in each cell is rapidly increased in practice. The resistance of the common source line is increased because as a junction resistance is generated along a feature of the trench region, the length of an actual sheet resistance and a specific resistance of a sidewall in the trench region are increased. Ion implantation is performed such that a relatively small dose of ions is implanted to the sidewall of the trench region. Thus, the resistance of the sidewall is considerably increased.

For most memory cells having a level of 0.25 μm to 0.18 μm or less, a shallow-trench isolation process is used as an isolation technique. The shallow-trench isolation process and the SAS process are necessary processes that reduce the area of the cells in a word line direction and in a bit line direction, respectively. However, when both processes are simultaneously applied, a problem occurs in that a source resistance is remarkably increased.

Since the flash memory cell employs an internal high voltage, the depth of the trench region is increased corresponding to the reduction in the area of the cell. Thus, the length of the common source line gradually increases, thereby providing a disadvantageous effect to the source resistance. For an embedded flash memory cell, detrimental effects occur, such as deterioration in programming characteristics and read speed.

SUMMARY OF THE INVENTION

Accordingly, the present invention is directed to a flash memory cell and a method for manufacturing the same that substantially obviates one or more of the problems due to limitations and disadvantages of the related art.

The present invention can provide a flash memory cell and a method for manufacturing the same that minimizes contact resistance in a common source line when applying a SAS process.

Additional features and advantages of the invention will be set forth in the description which follows, and in part will be apparent from the description, or may be learned from practice of the invention. The objectives and other advantages of the invention will be realized and attained by the structure and method particularly pointed out in the written description and claims hereof as well as the appended drawings.

To achieve these and other advantages and in accordance with the purpose of the present invention, as embodied and broadly described, a flash memory cell comprises a semiconductor substrate having an active region and a trench region; a first oxide layer, a first polysilicon layer, a second oxide layer, and a second polysilicon layer formed on the semiconductor substrate; a plurality of trench lines formed parallel to each other; a plurality of gate lines formed perpendicular to the plurality of trench lines; and a common source region formed parallel to and between the plurality of gate lines by implanting ions into the active region and the trench region, wherein a depth of ions implanted in the trench region is the same as a depth of ions implanted in the active region.

In another aspect of the present invention, a method for manufacturing a flash memory cell comprises forming an active region and a trench region on a semiconductor substrate; filling the trench region with a dielectric material to form an isolation layer; forming a first oxide layer, a first polysilicon layer, a second oxide layer, and a second polysilicon layer on the semiconductor substrate; patterning the second polysilicon layer, the second oxide layer, and the first polysilicon layer to form a plurality of gate lines; performing deep ion implantation in a deep portion of the active region using a self-aligned source mask; exposing the active region and the trench region through the self-aligned source mask by etching the isolation layer between the plurality of gate lines using the self-aligned source mask to form a common source region; and implanting ions in the common source region using the self-aligned source mask.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention, illustrate embodiment(s) of the invention and together with the description serve to explain the principles of the invention. In the drawings.

DETAILED DESCRIPTION OF THE INVENTION

Figure 1:
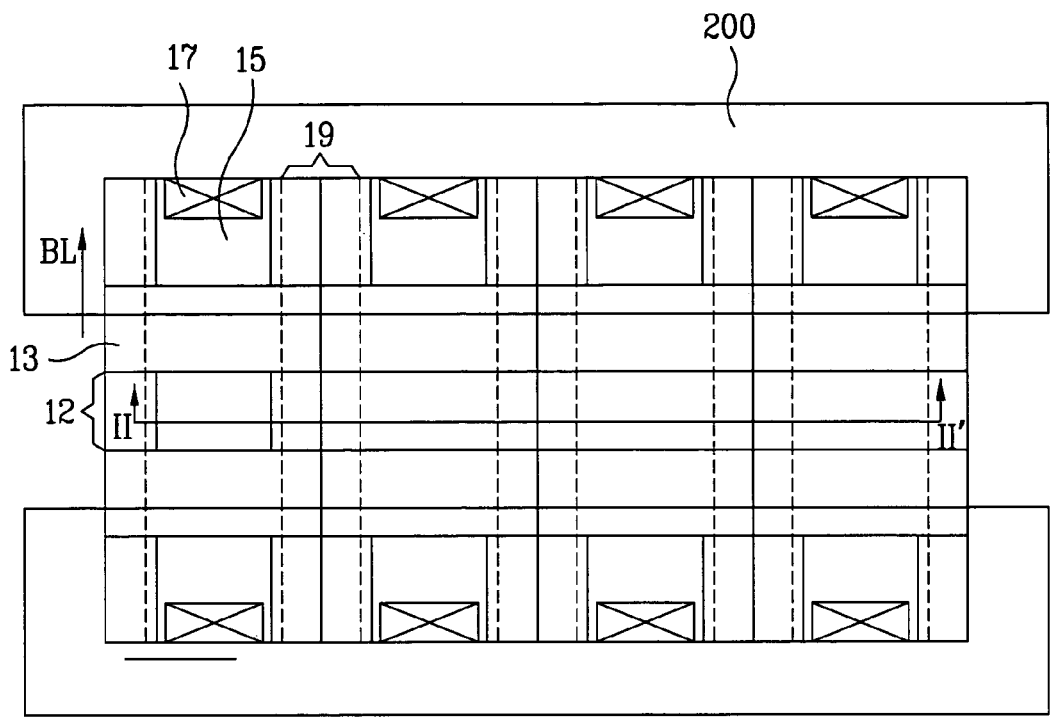
FIG. 1 is a layout view of a flash memory cell according to the present invention.

Reference will now be made in detail to embodiments of the present invention, examples of which are illustrated in the accompanying drawings. Wherever possible, like reference designations will be used throughout the drawings to refer to the same or similar parts. Also, layer thickness, relative proportions, and other dimensions as depicted may be exaggerated or distorted in the drawings to more clearly depict semiconductor components and materials, including layers, films, plates, and other areas. Furthermore, description of a component or material that, for example, is disposed or formed "directly on" (i.e., abutting) an underlying component or material is an indication that there is no interceding component or material, while other descriptions, including being "formed on" an underlying component or material, is to be taken as an indication that the described component or material may be disposed merely "above" (i.e., at any level higher than) the underlying component or material.

Figure 2:
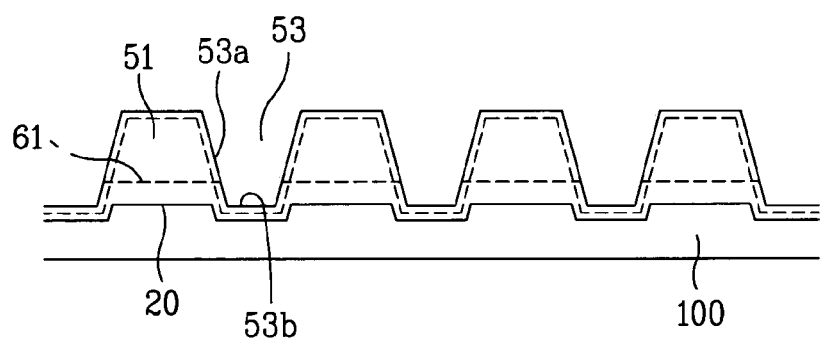
FIG. 2 is a cross-sectional view along line II-II' of FIG. 1.

As shown in FIGS. 1 and 2, the flash memory cell according to an embodiment of the present invention includes a plurality of trench lines 19 formed parallel to the bit lines (BL) on a semiconductor substrate 100. The plurality of trench lines 19 corresponds to an isolation region. A dotted line indicates a border of an inclined side surface of the trench lines 19.

The flash memory cell further includes a common source region 12 formed beneath the surface of the semiconductor substrate 100. The common source region 12 is formed by ion implantation of impurities in a direction of a word line.

A plurality of gate lines 13 is formed perpendicular to the plurality of trench lines 19, i.e., the plurality of gate lines 13 is parallel to the word line. A drain region 15 is formed in a region opposite the common source region 12 with respect to the plurality of gate lines 13. The drain region 15 has a drain contact 17 formed at a portion of the drain region 15.

As shown in FIG. 1, a portion of the plurality of gate lines 13 and a gap between adjacent gate lines 13 are exposed through a self-aligned source (SAS) mask 200. A border of an exposed portion of the SAS mask 200 is on the gate lines 13 and aligned with and parallel to the plurality of gate lines 13.

Figure 5:
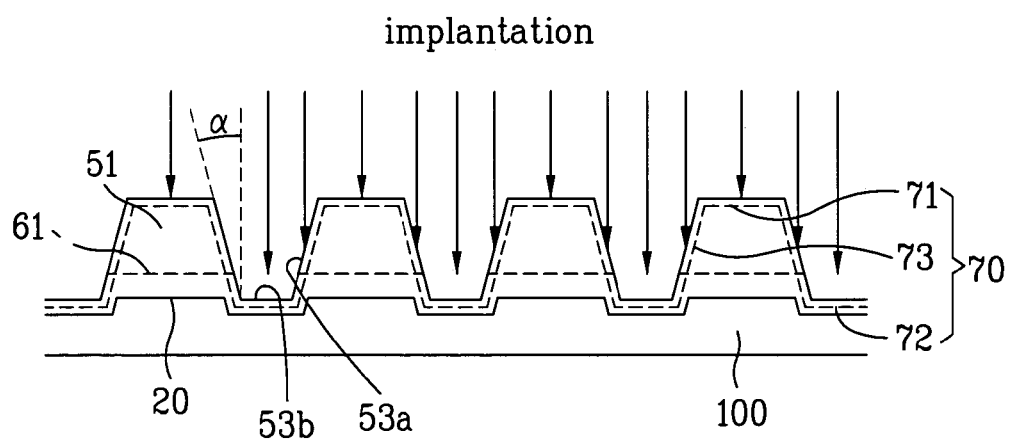

As shown in FIGS. 2 and 5, after the common source region 12 is formed using the SAS mask, ions 72 are implanted onto a surface of the trench region 53b and ions 61 are implanted into a deep portion of the source region 51. Accordingly, a common source line 20 in the common source region 12 is formed in a substantially straight line along the surface of the trench region 53b and the surface of the source region 51, thereby reducing the resistance of the common source line 20.

Figure 3:
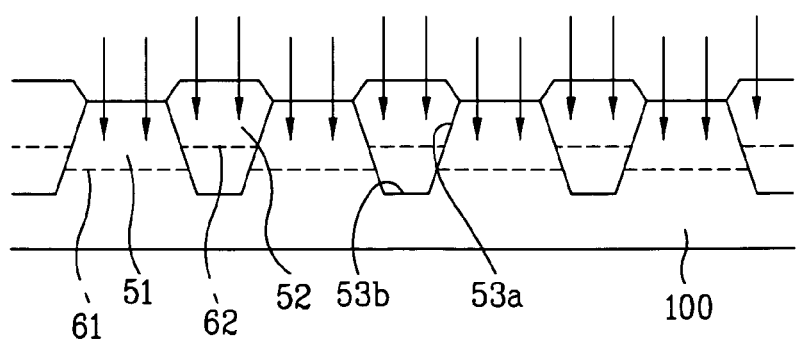
FIGS. 3 to 5 are cross-sectional views of a flash memory cell illustrating a method according to the present invention.
Figure 4:
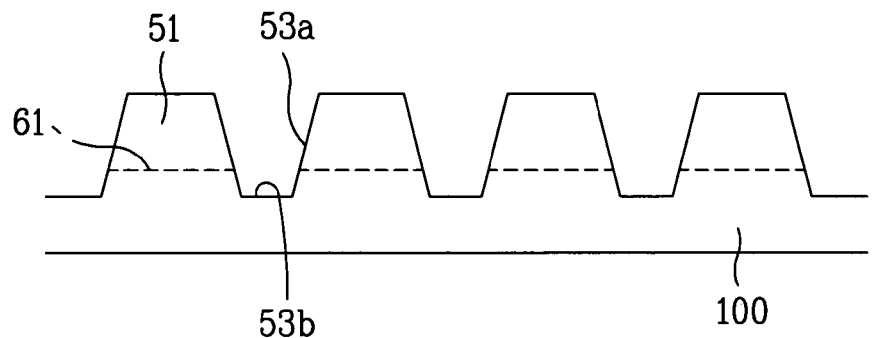

FIGS. 3-5 respectively illustrate steps of an exemplary method for manufacturing the flash memory cell according to the present invention.

As shown in FIG. 3, an active region 51 and a trench region 53 are formed on a semiconductor substrate 100. An isolation layer 52 is formed by filling the trench region 53 with a dielectric material. The trench region 53 corresponds to the plurality of trench lines 19 of FIG. 1. The plurality of trench lines 19 is formed parallel to a plurality of bit lines. A first oxide layer is then formed on the semiconductor substrate 100 excluding the plurality of trench lines 19. Then, a first polysilicon layer, a second oxide layer, and a second polysilicon layer are deposited on the semiconductor substrate 100 and the first oxide layer. Then, the second polysilicon layer, the second oxide layer, and the first polysilicon layer are successively etched by a photolithography process to thereby form a plurality of gate lines 13 perpendicular to the plurality of trench lines 19 i.e., the gate lines 13 are parallel to the word lines.

Then, deep ion implantation is performed using an SAS mask. This allows a portion of the plurality of gate lines 13 and a gap between adjacent gate lines 13 to be exposed. Ions are deeply implanted into the isolation layer 52 and the source region 51. For example, ions 61 are implanted to 70% of a total depth of the isolation layer 52, and ions 62 are implanted to a portion in the source region 51 slightly deeper than the ions 61 in the isolation layer 52.

The implanted ions 61 and 62 are N-type ions, and may be arsenic (As) or phosphorous (P) ions. For arsenic ions, a dose of N-type ions of $5 \times 10^{14}$-$5 \times 10^{15}$ and an implantation energy of 300-500 KeV for the N-type ions may be used. For phosphorous ions, a dose of N-type ions of $5 \times 10^{14}$-$5 \times 10^{15}$ and an implantation energy of 150-300 KeV for the N-type ions may be used.

Figure 6:
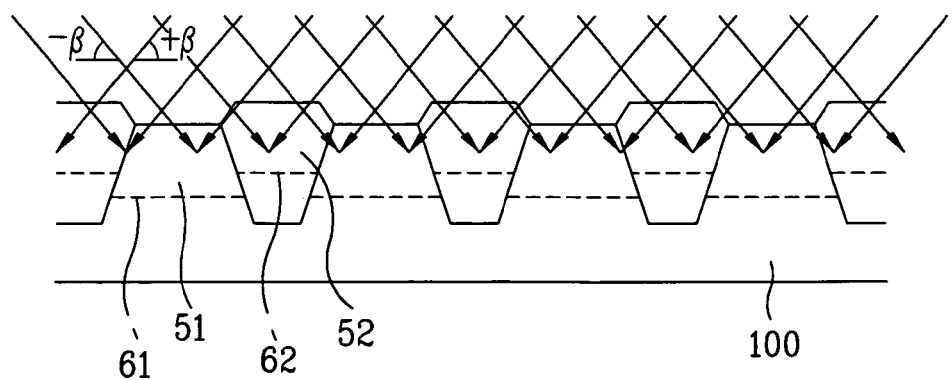
FIG. 6 is a cross-sectional view of a flash memory cell illustrating a deep ion implantation in a method according to the present invention.

The deep ion implantation may be performed in an inclined ion implantation, as shown in FIG. 6. The inclined ion implantation is performed in parallel with the word line, and half of the ions are preferably implanted at a positive angle (+β) and the remaining ions are implanted at a negative angle (−β).

As shown in FIG. 4, the surfaces of the trench region 53 and the source region 51 are exposed by etching the isolation layer 52 formed between the adjacent gate lines 13 in the first oxide layer and the trench lines 19 using the SAS mask. Then, the ions 62 implanted to the isolation layer 52 are removed by removing the isolation layer 52.

Ion implantation is performed as shown in FIG. 5. During this process, ions 70, including ions 71, 72 and 73, are implanted to the surfaces of the source region 51 and the trench region 53 along the common source region 12.

Ions 73 are implanted at an angle of α to a sidewall 53a of the trench region 53. Accordingly, a junction depth and a dose of the ions 73 are reduced by sin(α) of the original ion implantation energy and dose. As a result, the resistance of ions 73 implanted to the sidewall 53a of the trench region 53 can be ten-fold or more than that of other portions.

Ions 72 implanted to the surface of the trench region 53 and ions 61 implanted to a deep portion of the source region 51 via deep ion implantation are connected to each other and have a substantially identical height. However, since ions 72 and 61 are implanted in this manner, ions 71 implanted to the surface of the source region 51 and ions implanted to the sidewall 53a of the trench region 53 are excluded from the common source line 20. In addition, the ions 73 implanted to the sidewall 53a of the trench region 53 do not substantially provide the effect of increased resistance.

In the flash memory cell and the method for manufacturing the same according to the present invention, deep ion implantation is performed before etching the isolation layer 52 such that the common source line of the common source region is formed in a straight line along the surfaces of the trench region and the source region, thereby reducing the resistance of the common source line. As a result, the flash memory cell of the present invention can remarkably reduce the voltage drop (I×R) and has improved reading and programming efficiencies. Thus, the flash memory cell of the present invention has enhanced characteristics.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for manufacturing a flash memory cell, comprising:
    forming an active region and a trench region on a semiconductor substrate;
    filling the trench region with a dielectric material to form an isolation layer;
    forming a first oxide layer, a first polysilicon layer, a second oxide layer, and a second polysilicon layer on the semiconductor substrate;
    patterning the second polysilicon layer, the second oxide layer, and the first polysilicon layer to form a plurality of gate lines;
    performing deep ion implantation in a deep portion of the active region using a self-aligned source mask;
    exposing the active region and the trench region through the self-aligned source mask by etching the isolation layer between the plurality of gate lines using the self-aligned source mask to form a common source region; and
    implanting ions in the common source region using the self-aligned source mask.

2. The method according to claim 1, wherein the active region is a source region.

3. The method according to claim 2, wherein the implanting ions step comprises implanting ions into surfaces of the source region and the trench region.

4. The method according to claim 3, wherein an implantation height of the ions in a deep portion of the source region is approximately the same as an implantation height of the ions in the surface of the trench region.

5. The method according to claim 1, wherein the deep ion implantation uses N-type ions.

6. The method according to claim 5, wherein the N-type ions are arsenic (As) ions.

7. The method according to claim 6, wherein the deep ion implantation is performed at a dosage of $5 \times 10^{14}$-$5 \times 10^{15}$ and an implantation energy of 300-500 KeV.

8. The method according to claim 5, wherein the N-type ions are phosphorous (P) ions.

9. The method according to claim 8, wherein the deep ion implantation is performed at a dosage of $5 \times 10^{14}$-$5 \times 10^{5}$ and an implantation energy of 150-300 KeV.

10. The method according to claim 1, wherein the deep ion implantation step is performed at an inclined angle and parallel to a word line.

11. The method according to claim 10, wherein the inclined angle of the deep ion implantation step is a positive angle for one half of the implantation and is a negative angle for the other half of the implantation.

12. The method according to claim 1, further comprising forming a plurality of trench lines.

13. The method according to claim 12, wherein the plurality of trench lines is parallel to a bit line and wherein the plurality of gate lines is parallel to a word line.

14. The method according to claim 1, wherein the self-aligned source mask exposes a portion of the plurality of gate lines and a gap between adjacent gate lines.

* * * * *